(12) United States Patent
Imamura et al.

(10) Patent No.: US 8,580,340 B2
(45) Date of Patent: Nov. 12, 2013

(54) SUBSTRATE PROCESSING APPARATUS AND SUBSTRATE PROCESSING METHOD

(75) Inventors: Masanori Imamura, Kyoto (JP); Akihiro Hisai, Kyoto (JP); Hidetoshi Sagawa, Kyoto (JP)

(73) Assignee: Sokudo Co., Ltd. (JP)

( * ) Notice: Subject to any disclaimer, the term of this patent is extended or adjusted under 35 U.S.C. 154(b) by 184 days.

(21) Appl. No.: 12/898,856

(22) Filed: Oct. 6, 2010

(65) Prior Publication Data
US 2011/0135820 A1     Jun. 9, 2011

(30) Foreign Application Priority Data

Dec. 7, 2009  (JP) ................................. 2009-277754

(51) Int. Cl.
*B05D 3/12* (2006.01)
(52) U.S. Cl.
USPC ............. 427/240; 427/425; 118/52; 118/320; 438/780; 438/782
(58) Field of Classification Search
USPC ............. 427/240, 425; 118/52, 320; 438/780, 438/782
See application file for complete search history.

(56) References Cited

U.S. PATENT DOCUMENTS

| 5,837,319 A * | 11/1998 | Walters et al. ................ 427/240 |
| 5,843,527 A | 12/1998 | Sanada | |
| 5,989,632 A | 11/1999 | Sanada et al. | |
| 6,117,486 A | 9/2000 | Yoshihara | |
| 6,440,218 B1 * | 8/2002 | Sanada et al. ................. 118/697 |
| 2001/0029111 A1 * | 10/2001 | You et al. ...................... 438/782 |

(Continued)

FOREIGN PATENT DOCUMENTS

| JP | 63-128628 | 6/1988 |
| JP | 9-7930 | 1/1997 |

(Continued)

OTHER PUBLICATIONS

Decision to Grant a Patent (Korean) dated May 20, 2012, in corresponding Korean Application No. 029428510; pp. 1-2, May 9, 2012.

(Continued)

*Primary Examiner* — Kirsten Jolley
(74) *Attorney, Agent, or Firm* — Ostrolenk Faber LLP (57) ABSTRACT

After a solvent is discharged onto a substrate in a period from a time point t0 to a time point t1, rotation of the substrate is started at a time point t2. A resist liquid is discharged onto a center portion of a target surface of the substrate at a time point t3. A rotation speed of the substrate starts to decrease at a time point t4, and attains a first speed after a certain period of time. The discharge of the resist liquid is stopped at a time point t5. The rotation of the substrate is accelerated in a period from a time point t6 to a time point t7, and the rotation speed of the substrate attains a second speed at the time point t7. The rotation of the substrate is decelerated in a period from the time point t7 to a time point t8, and the rotation speed of the substrate attains a third speed at the time point t8. Here, deceleration of the rotation of the substrate in the period from the time point t7 to the time point t8 is smaller than acceleration of the rotation of the substrate in the period from the time point t6 to the time point t7.

10 Claims, 9 Drawing Sheets

(56) References Cited

U.S. PATENT DOCUMENTS

| | | | |
|---|---|---|---|
| 2007/0092642 A1 | 4/2007 | Yoshihara et al. | |
| 2007/0092643 A1 | 4/2007 | Yoshihara et al. | |
| 2008/0176410 A1 | 7/2008 | Muramatsu et al. | |
| 2009/0226615 A1* | 9/2009 | Nakazawa | 427/256 |
| 2010/0209607 A1* | 8/2010 | Takayanagi et al. | 427/240 |
| 2011/0005459 A1 | 1/2011 | Yoshihara et al. | |
| 2011/0146572 A1 | 6/2011 | Yoshihara et al. | |

FOREIGN PATENT DOCUMENTS

| | | |
|---|---|---|
| JP | 10-125581 | 5/1998 |
| JP | 10-137674 | 5/1998 |
| JP | 11-260717 | 9/1999 |
| JP | 2000-68182 | 3/2000 |
| JP | 2000-77310 | 3/2000 |
| JP | 3315607 | 8/2002 |
| JP | 3420900 | 6/2003 |
| JP | 2007-115907 | 5/2007 |
| JP | 2007-115936 | 5/2007 |
| JP | 2008-177410 | 7/2008 |

OTHER PUBLICATIONS

Office Action (Reasons for Refusal) for counterpart Japanese Application 2009-277754, dated Apr. 23, 2013.

* cited by examiner

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method for forming a film of a coating liquid on a substrate.

2. Description of the Background Art

A rotary substrate processing apparatus is used for forming a film of a coating liquid such as a photoresist liquid (hereinafter abbreviated as a resist liquid) on substrates such as semiconductor wafers, glass substrates for liquid crystal displays, photomasks, and optical disks.

In a resist coating method and a resist coating apparatus described in JP 11-260717 A, a target substrate is rotated at a high speed (a first rotation speed) while the resist liquid is supplied onto substantially the center of the target substrate. The supplied resist liquid is applied onto the target substrate while spreading outward in a radial direction.

After the resist liquid is supplied, the rotation speed of the target substrate decreases to a low speed (a second rotation speed), so that a film thickness of the resist liquid is adjusted.

Finally, the rotation speed of the target substrate increases to a medium speed (a third rotation speed). This causes the residual resist liquid to be shaken off.

In a resist coating method and a resist coating apparatus described in JP 2007-115907 A, the rotation speed of the target substrate decreases to a rotation speed that is lower than the first rotation speed and higher than the second rotation speed, and then decreases to the second rotation speed.

In a resist coating method and a resist coating apparatus described in JP 2007-115936 A, when the rotation speed of the target substrate decreases from the first rotation speed to the second rotation speed, deceleration (speed reduction ratio) decreases as the rotation speed of the target substrate is close to the second rotation speed.

JP 11-260717 A, JP 2007-115907 A and JP 2007-115936 A describe that the foregoing methods and apparatuses allow for a uniform film thickness of the resist liquid and reduction in consumption of the resist liquid.

In recent years, however, further reduction in consumption of the resist liquid is required. In the methods and apparatuses of JP 11-260717 A, JP 2007-115907 A and JP 2007-115936 A, film thickness uniformity of the resist liquid tends to be degraded with decreasing the consumption of the resist liquid. Therefore, the consumption of the resist liquid cannot be sufficiently reduced.

BRIEF SUMMARY OF THE INVENTION

An object of the present invention is to provide a substrate processing apparatus and a substrate processing method capable of sufficiently reducing consumption of a coating liquid and ensuring film thickness uniformity of the coating liquid on a substrate.

(1) According to an aspect of the present invention, a substrate processing apparatus arranged to form a film of a coating liquid on a substrate includes a rotating/holding device arranged to hold and rotate the substrate in a horizontal attitude, a coating liquid supply system arranged to supply the coating liquid onto the substrate held by the rotating/holding device, and a controller arranged to control the rotating/holding device such that after the coating liquid supply system supplies the coating liquid onto the substrate rotated by the rotating/holding device, a rotation speed of the substrate increases from a first speed to a second speed in a first period, and the rotation speed of the substrate decreases from the second speed to a third speed in a second period, wherein deceleration of rotation of the substrate in the second period is smaller than acceleration of rotation of the substrate in the first period.

In the substrate processing apparatus, the rotating/holding device holds and rotates the substrate in the horizontal attitude, and the coating liquid supply system supplies the coating liquid onto the substrate. The controller controls the rotating/holding device such that the rotation speed of the substrate increases from the first speed to the second speed in the first period, and then decreases from the second speed to the third speed in the second period. Here, the deceleration of the rotation of the substrate in the second period is smaller than the acceleration of the rotation of the substrate in the first period.

The rotation of the substrate is accelerated in the first period, so that the coating liquid on a center portion of the substrate spreads over a peripheral portion of the substrate while being dried. This allows the film of the coating liquid to be formed on the substrate even though an amount of the supplied coating liquid is small.

Then, the rotation of the substrate is decelerated in the second period, thereby significantly reducing the centrifugal force applied to the coating liquid on the peripheral portion of the substrate and hardly reducing the centrifugal force applied to the coating liquid on the center portion of the substrate. This prevents the coating liquid from accumulating only on the center portion of the substrate. As a result, film thickness uniformity of the coating liquid on the substrate can be ensured.

(2) The controller may control the rotating/holding device such that the rotation speed of the substrate when supply of the coating liquid by the coating liquid supply system is started attains a fourth speed that is higher than the third speed.

In this case, the coating liquid is supplied by the coating liquid supply system when the rotation speed of the substrate attains the fourth speed that is higher than the third speed. This causes the coating liquid to be previously scattered over the entire substrate. As a result, the film of the coating liquid can be formed on the substrate using a small amount of coating liquid.

(3) The first speed may be lower than the third speed, and the controller may control the rotating/holding device such that the rotation speed of the substrate attains the first speed by end of the supply of the coating liquid by the coating liquid supply system.

In this case, the rotation speed of the substrate decreases to the first speed that is lower than the third speed by the end of the supply of the coating liquid by the coating liquid supply system. This allows the coating liquid to be accumulated on the center portion of the substrate before the rotation speed of the substrate increases from the first speed to the second speed in the first period. As a result, the film of the coating liquid can be formed on the substrate using a smaller amount of the coating liquid.

(4) The controller may control the rotating/holding device such that the rotation speed of the substrate attains a fifth speed that is lower than the first speed and the third speed by end of the supply of the coating liquid by the coating liquid supply system, and the rotation speed of the substrate then attains a speed that is higher than the fifth speed and not higher than the first speed in a period before the first period.

In this case, the rotation speed of the substrate decreases to the fifth speed that is lower than the first speed and the third speed by the end of the supply of the coating liquid by the coating liquid supply system. Then, the rotation speed of the substrate increases from the fifth speed to the first speed. This allows the coating liquid on the substrate to be dried in a period where the rotation speed of the substrate increases from the fifth speed to the first speed. Accordingly, the film of the coating liquid can be more efficiently formed on the substrate in the case of using the coating liquid with slow drying characteristics.

(5) The first speed may be equal to the fourth speed, and the controller may control the rotating/holding device such that the rotation speed of the substrate attains the first speed in a period from start of the supply of the coating liquid by the coating liquid supply system to start of the first period.

In this case, the rotation speed of the substrate attains the first speed that is equal to the fourth speed in the period from the start of the supply of the coating liquid by the coating liquid supply system to the start of the first period. Accordingly, the film of the coating liquid can be more efficiently formed on the substrate in the case of using the coating liquid with quick drying characteristics.

(6) The controller may control the rotating/holding device such that a cycle in which the rotation speed of the substrate increases and then decreases is performed one or a plurality of times after the second period, and the deceleration of the rotation of the substrate is smaller than the acceleration of the rotation of the substrate in each cycle.

In this case, the cycle in which the rotation speed of the substrate increases and then decreases is performed one or a plurality of times after the second period. The deceleration of the rotation of the substrate is smaller than the acceleration of the rotation of the substrate in each cycle. This causes the coating liquid on the center portion of the substrate to more easily spread over the peripheral portion of the substrate. Therefore, the coating liquid is sufficiently prevented from accumulating only on the center portion of the substrate. This results in more improved film thickness uniformity of the coating liquid on the substrate.

(7) The acceleration of the rotation of the substrate in the first period may be not less than 10000 rpm/s, and the deceleration of the rotation of the substrate in the second period may be smaller than 10000 rpm/s.

In this case, the coating liquid on the center portion of the substrate can efficiently spread over the peripheral portion of the substrate. This allows the film thickness uniformity of the coating liquid on the substrate to be efficiently ensured.

(8) The second speed may be not less than 2000 rpm. In this case, the coating liquid on the center portion of the substrate can efficiently spread over the peripheral portion of the substrate while being dried. Accordingly, the film of the coating liquid can be more reliably formed on the substrate even though the amount of the supplied coating liquid is small.

(9) According to another aspect of the present invention, a substrate processing apparatus arranged to form a film of a coating liquid on a substrate includes a rotating/holding device arranged to hold and rotate the substrate in a horizontal attitude, a coating liquid supply system arranged to supply the coating liquid onto the substrate held by the rotating/holding device, and a controller arranged to control the rotating/holding device such that a rotation speed of the substrate decreases in a predetermined period after the coating liquid supply system supplies the coating liquid onto the substrate rotated by the rotating/holding device, wherein deceleration of rotation of the substrate in the predetermined period is smaller than 10000 rpm/s.

In the substrate processing apparatus, the rotating/holding device holds and rotates the substrate in the horizontal attitude, and the coating liquid supply system supplies the coating liquid onto the substrate. The controller controls the rotating/holding device such that the rotation speed of the substrate decreases in the predetermined period. Here, the deceleration of the rotation of the substrate in the predetermined period is smaller than 10000 rpm/s.

In this case, the rotation of the substrate causes the coating liquid on the center portion of the substrate to spread over the peripheral portion of the substrate. Therefore, the film of the coating liquid can be formed on the substrate even though the amount of the supplied coating liquid is small in the case of using the coating liquid with quick drying characteristics.

The rotation of the substrate is decelerated in the predetermined period, thereby significantly reducing the centrifugal force applied to the coating liquid on the peripheral portion of the substrate and hardly reducing the centrifugal force applied to the coating liquid on the center portion of the substrate. Therefore, the coating liquid on the center portion of the substrate easily spreads over the peripheral portion of the substrate. This prevents the coating liquid from accumulating only on the center portion of the substrate. As a result, film thickness uniformity of the coating liquid on the substrate can be ensured.

(10) According to still another aspect of the present invention, a substrate processing method for forming a film of a coating liquid on a substrate includes the steps of rotating the substrate in a horizontal attitude, supplying the coating liquid onto the substrate that is rotated, increasing a rotation speed of the substrate from a first speed to a second speed in a first period after supply of the coating liquid, and decreasing the rotation speed of the substrate from the second speed to a third speed in a second period after the first period, wherein deceleration of rotation of the substrate in the second period is smaller than acceleration of rotation of the substrate in the first period.

In the substrate processing method, the substrate is rotated in the horizontal attitude while the coating liquid is supplied onto the substrate. The rotation speed of the substrate increases from the first speed to the second speed in the first period, and then decreases from the second speed to the third speed in the second period. Here, the deceleration of the rotation of the substrate in the second period is smaller than the acceleration of the rotation of the substrate in the first period.

The rotation of the substrate is accelerated in the first period, so that the coating liquid on the center portion of the substrate spreads over the peripheral portion of the substrate while being dried. Accordingly, the film of the coating liquid can be formed on the substrate even though the amount of the supplied coating liquid is small.

Then, the rotation of the substrate is decelerated in the second period, thereby significantly reducing the centrifugal force applied to the coating liquid on the peripheral portion of the substrate and hardly reducing the centrifugal force applied to the coating liquid on the center portion of the substrate. Therefore, the coating liquid on the center portion of the substrate easily spreads over the peripheral portion of the substrate. This prevents the coating liquid from accumulating only on the center portion of the substrate. As a result, film thickness uniformity of the coating liquid on the substrate can be ensured.

(11) According to yet another aspect of the present invention, a substrate processing method for forming a film of a coating liquid on a substrate includes the steps of rotating the substrate in a horizontal attitude, supplying the coating liquid onto the substrate that is rotated, and decreasing a rotation speed of the substrate in a predetermined period after supply of the coating liquid, wherein deceleration of rotation of the substrate in the predetermined period is smaller than 10000 rpm/s.

In the substrate processing method, the substrate is rotated in the horizontal attitude while the coating liquid is supplied onto the substrate. The rotation speed of the substrate decreases in the predetermined period. Here, the deceleration of the rotation of the substrate in the predetermined period is smaller than 10000 rpm/s.

In this case, the rotation of the substrate causes the coating liquid on the center portion of the substrate to spread over the peripheral portion of the substrate. Therefore, the film of the coating liquid can be formed on the substrate even though the amount of the supplied coating liquid is small in the case of using the coating liquid with quick drying characteristics.

The rotation of the substrate is decelerated in the predetermined period, thereby significantly reducing the centrifugal force applied to the coating liquid on the peripheral portion of the substrate and hardly reducing the centrifugal force applied to the coating liquid on the center portion of the substrate. Therefore, the coating liquid on the center portion of the substrate easily spreads over the peripheral portion of the substrate. This prevents the coating liquid from accumulating only on the center portion of the substrate. As a result, film thickness uniformity of the coating liquid on the substrate can be ensured.

Other features, elements, characteristics, and advantages of the present invention will become more apparent from the following description of preferred embodiments of the present invention with reference to the attached drawings.

DETAILED DESCRIPTION OF THE INVENTION

[1] First Embodiment

Hereinafter, description will be made of a substrate processing apparatus and a substrate processing method according to a first embodiment while referring to the drawings. A resist liquid is used as a coating liquid in the present embodiment.

(1) Substrate Processing Apparatus

Figure 1:
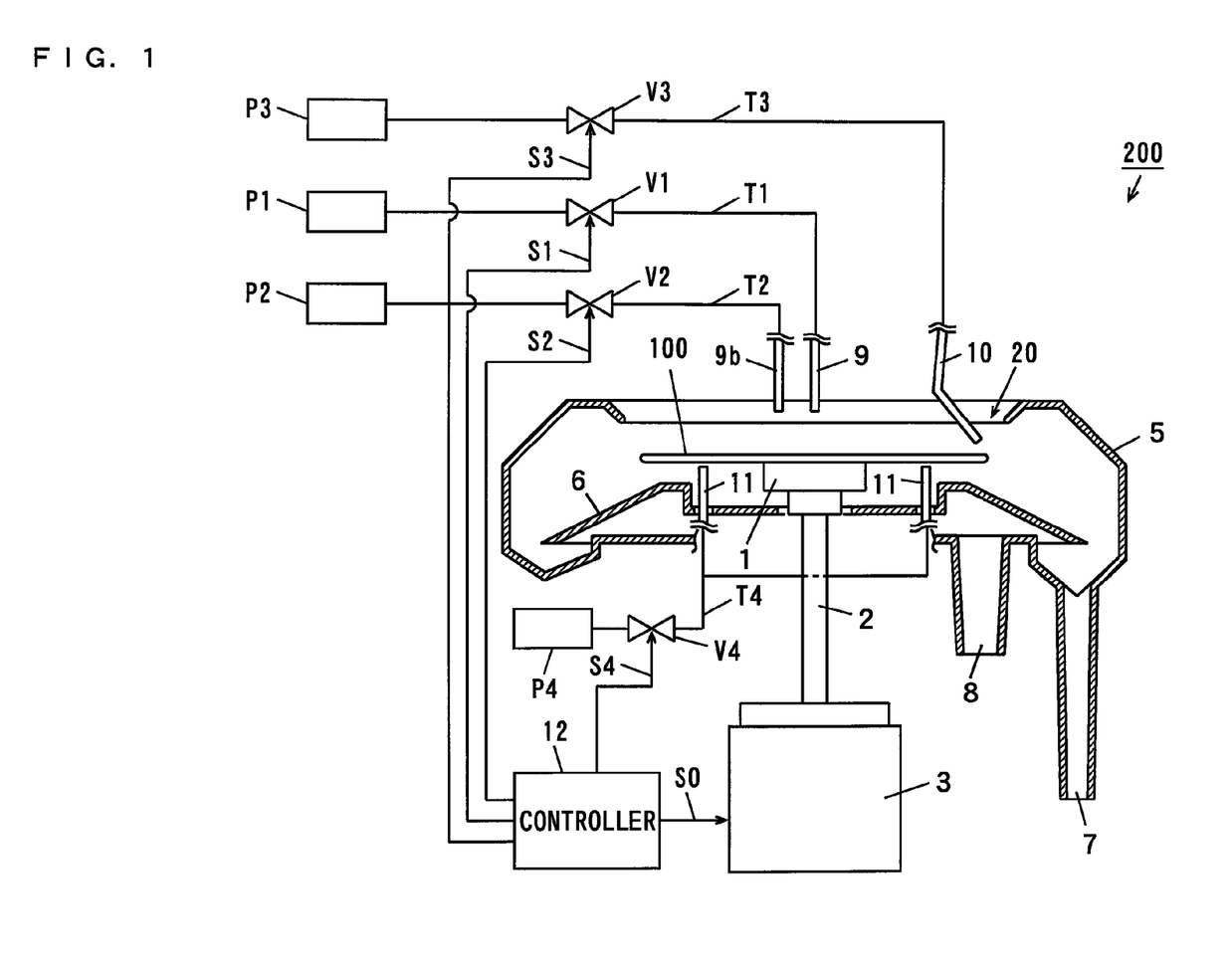
FIG. 1 is a schematic sectional view of a substrate processing apparatus according to a first embodiment.

FIG. 1 is a schematic sectional view of a substrate processing apparatus 200 according to the first embodiment. In FIG. 1, the substrate processing apparatus 200 is a rotary substrate processing apparatus, and includes a rotating/holding unit 1 that holds and rotates a substrate 100 in a horizontal attitude. The rotating/holding unit 1 is attached to the tip of a rotation shaft 2 of a motor 3, and rotated around the vertical axis.

A splash-guarding cup 5 is provided to surround the substrate 100 held by the rotating/holding unit 1. The cup 5 is provided with an opening 20 in its upper surface, and a waste liquid port 7 and a plurality of gas exhaust ports 8 in its lower part. The gas exhaust ports 8 are connected to a gas exhaust system in the factory. A current plate 6 is arranged below the rotating/holding unit 1. The current plate 6 has an inclined surface that is obliquely downwardly inclined toward an outer peripheral portion.

A resist nozzle 9 that discharges a resist liquid and a solvent nozzle 9b that discharges a solvent such as a thinner are provided above the substrate 100 so as to be able to move up and down and move between respective positions above the substrate 100 and respective stand-by positions outside the cup 5.

The resist nozzle 9 is connected to a resist liquid supply source P1 through a resist liquid supply pipe T1. The solvent nozzle 9b is connected to a solvent supply source P2 through a solvent supply pipe T2. A valve V1 is inserted in the resist liquid supply pipe T1, and a valve V2 is inserted in the solvent supply pipe T2. The valve V1 is opened, so that the resist liquid is supplied from the resist liquid supply source P1 to the resist nozzle 9 through the resist liquid supply pipe T1. The valve V2 is opened, so that the solvent is supplied from the solvent supply source P2 to the solvent nozzle 9b through the solvent supply pipe T2.

An edge rinse nozzle 10 that discharges a rinse liquid (hereinafter referred to as an edge rinse liquid) such as a solvent for removing the resist film from an peripheral portion of the substrate 100 is provided so as to be able to move up and down and move between a position above the peripheral portion of the substrate 100 and a stand-by position. A plurality of back rinse nozzles 11 that discharge a rinse liquid (hereinafter referred to as a back rinse liquid) such as a solvent for cleaning a back surface (a surface on the opposite side of a target surface) of the substrate 100 are arranged below the substrate 100.

The edge rinse nozzle 10 is connected to an edge rinse liquid supply source P3 through an edge rinse liquid supply pipe T3. The back rinse nozzles 11 are connected to a back rinse liquid supply source P4 through a back rinse liquid supply pipe T4. A valve V3 is inserted in the edge rinse liquid supply pipe T3, and a valve V4 is inserted in the back rinse liquid supply pipe T4. The valve V3 is opened, so that the edge rinse liquid is supplied from the edge rinse liquid supply source P3 to the edge rinse nozzle 10 through the edge rinse liquid supply pipe T3. The valve 4 is opened, so that the back rinse liquid is supplied from the back rinse liquid supply source P4 to the back rinse nozzles 11 through the back rinse liquid supply pipe T4.

The substrate processing apparatus 200 includes a controller 12. The controller 12 controls a rotation speed of the motor 3 by applying a rotation signal S0 to the motor 3. This causes a rotation speed of the substrate 100 held by the rotating/holding unit 1 to be controlled. The controller 12 controls the opening/closing of the valves V1 to V4 by applying a resist liquid discharge signal S1, a solvent discharge signal S2, an edge rinse liquid discharge signal S3 and a back rinse liquid discharge signal S4 to the valves V1 to V4, respectively. This causes discharge timings of the resist liquid, the solvent, the edge rinse liquid and the back rinse liquid to be controlled.

(2) Processing of the Substrate

Figure 2:
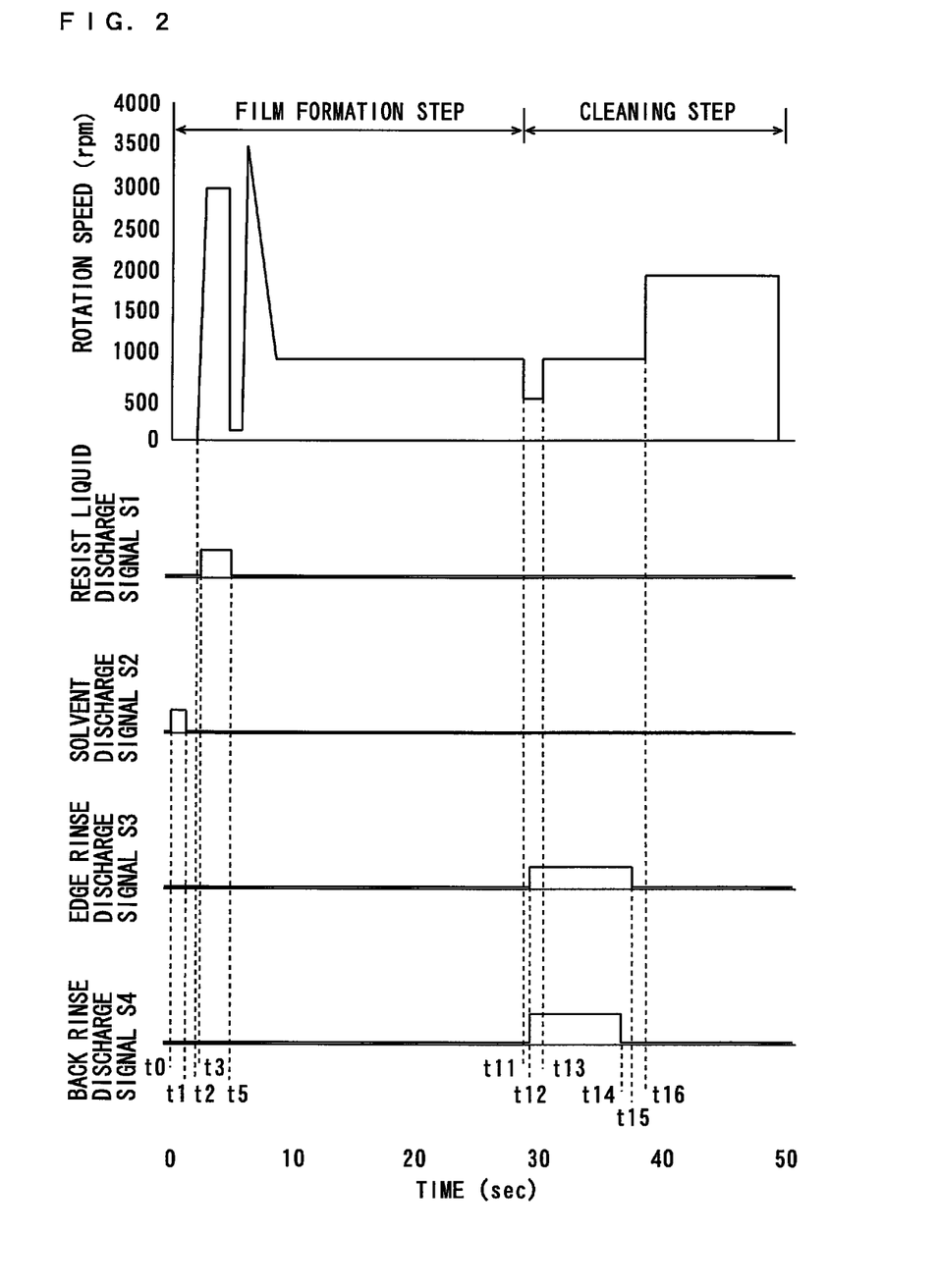
FIG. 2 is a diagram showing a change in a rotation speed of a substrate and changes of signals in the substrate processing apparatus.

Next, description is made of processing steps of the substrate 100 in the substrate processing apparatus 200 of FIG. 1. FIG. 2 is a diagram showing a change in the rotation speed of the substrate 100 and changes of the signals S1 to S4 in the substrate processing apparatus 200.

As shown in FIG. 2, the processing steps of the substrate 100 include a film formation step and a cleaning step. In the film formation step, the resist liquid is applied onto the target surface of the substrate 100, and the peripheral portion of the target surface and the back surface of the substrate 100 are cleaned in the cleaning step.

The substrate 100 is held by the rotating/holding unit 1 with the target surface directed upward (see FIG. 1). The rotation of the substrate 100 is stopped and S1 to S4 are at a low level in an initial state.

In the film formation step, first, the solvent nozzle 9b moves to a position above a center portion of the substrate 100. The solvent discharge signal S2 attains a high level at a time point t0. This causes the solvent to be discharged from the solvent nozzle 9b onto the center portion of the target surface of the substrate 100.

The solvent discharge signal S2 attains a low level at a time point t1. This causes the discharge of the solvent from the solvent nozzle 9b to be stopped. Next, the rotation of the substrate 100 is started at a time point t2. This causes the solvent discharged onto the center portion of the target surface of the substrate 100 to spread over the entire target surface of the substrate 100 by a centrifugal force caused by the rotation of the substrate 100.

The resist nozzle 9 subsequently moves to a position above the center portion of the substrate 100. The resist liquid discharge signal S1 attains a high level at a time point t3. This causes the resist liquid to be discharged from the resist nozzle 9 onto the center portion of the target surface of the substrate 100. Then, the resist liquid discharge signal S1 attains a low level at a time point t5. Thus, the discharge of the resist liquid from the resist nozzle 9 is stopped.

The resist liquid discharged onto the center portion of the target surface of the substrate 100 spreads over the entire target surface of the substrate 100 by the centrifugal force caused by the rotation of the substrate 100.

In the present embodiment, the motor 3 is controlled such that the rotation speed of the substrate 100 gradually changes in the film formation step. Accordingly, consumption of the resist liquid can be reduced while the resist liquid can be uniformly applied onto the target surface of the substrate 100. Details of control of the rotation speed of the substrate 100 in the film formation step will be described below.

In the cleaning step, first, the rotation speed of the substrate 100 decreases to 500 rpm, for example, at a time point t11. Next, the edge rinse liquid discharge signal S3 and the back rinse liquid discharge signal S4 attain a high level at a time point t12. Thus, the edge rinse liquid is discharged from the edge rinse nozzle 10 onto the peripheral portion of the target surface of the substrate 100, and the back rinse liquid is discharged from the back rinse nozzles 11 onto the back surface of the substrate 100.

After the discharge of the edge rinse liquid and the back rinse liquid onto the substrate 100 is started, the rotation speed of the substrate 100 increases to 1000 rpm, for example, at a time point t13. At this time, the peripheral portion of the target surface of the substrate 100 is cleaned by the edge rinse liquid while the back surface of the substrate 100 is cleaned by the back rinse liquid. This causes the resist liquid, dust and so on adhering to the peripheral portion of the target surface and the back surface of the substrate 100 to be removed. After that, the back rinse liquid discharge signal S4 attains a low level at a time point t14, and the edge rinse liquid discharge signal S3 attains a low level at a time point t15. This causes the discharge of the back rinse liquid and the edge rinse liquid to be sequentially stopped.

After the discharge of the edge rinse liquid and the back rinse liquid is stopped, the rotation speed of the substrate 100 increases to 2000 rpm, for example, at a time point t16. Thus, the edge rinse liquid and the back rinse liquid adhering to the substrate 100 are shaken off to be removed from the substrate 100. The rotation of the substrate 100 is then stopped. In this manner, a series of processing steps in the substrate processing apparatus 200 is finished.

(3) Details of the Film Formation Step

Figure 3:
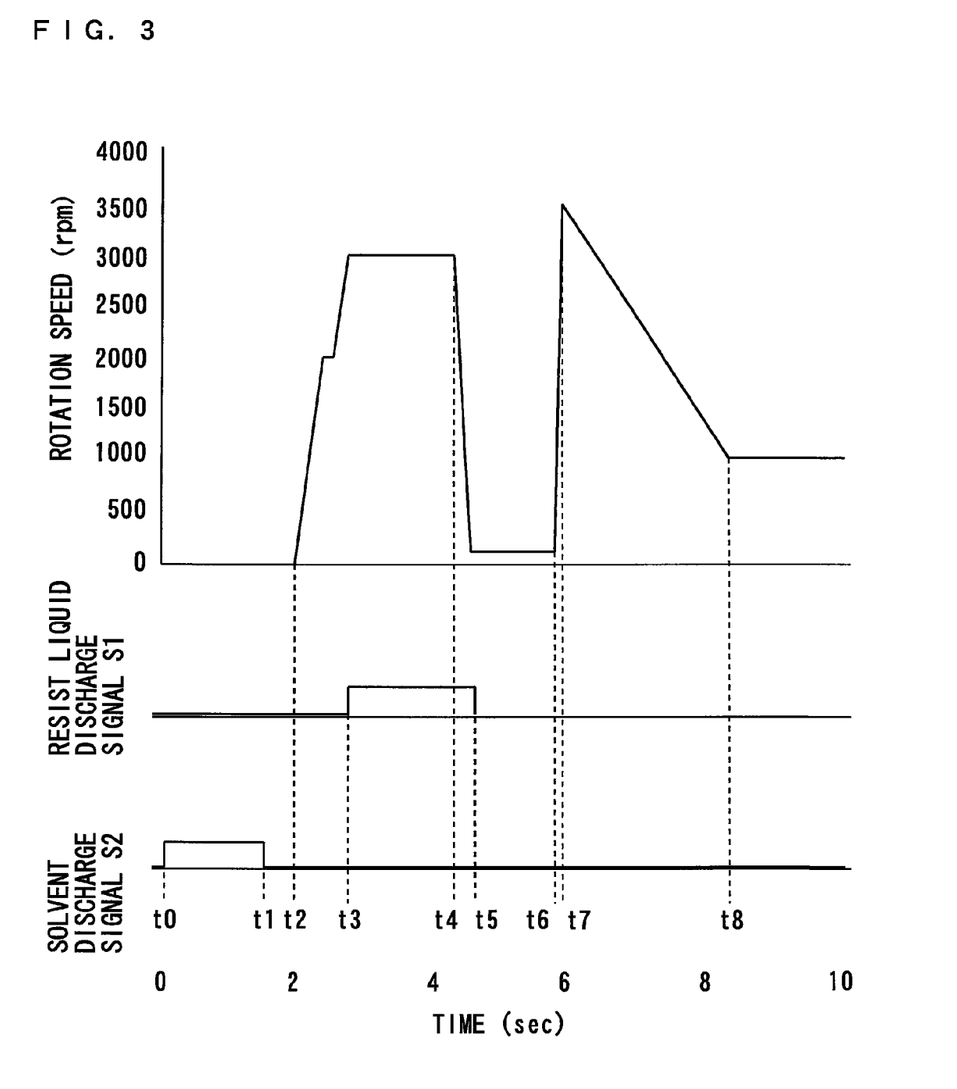
FIG. 3 is a diagram showing the change in the rotation speed of the substrate and the changes of the signals in a film formation step.
Figure 4:
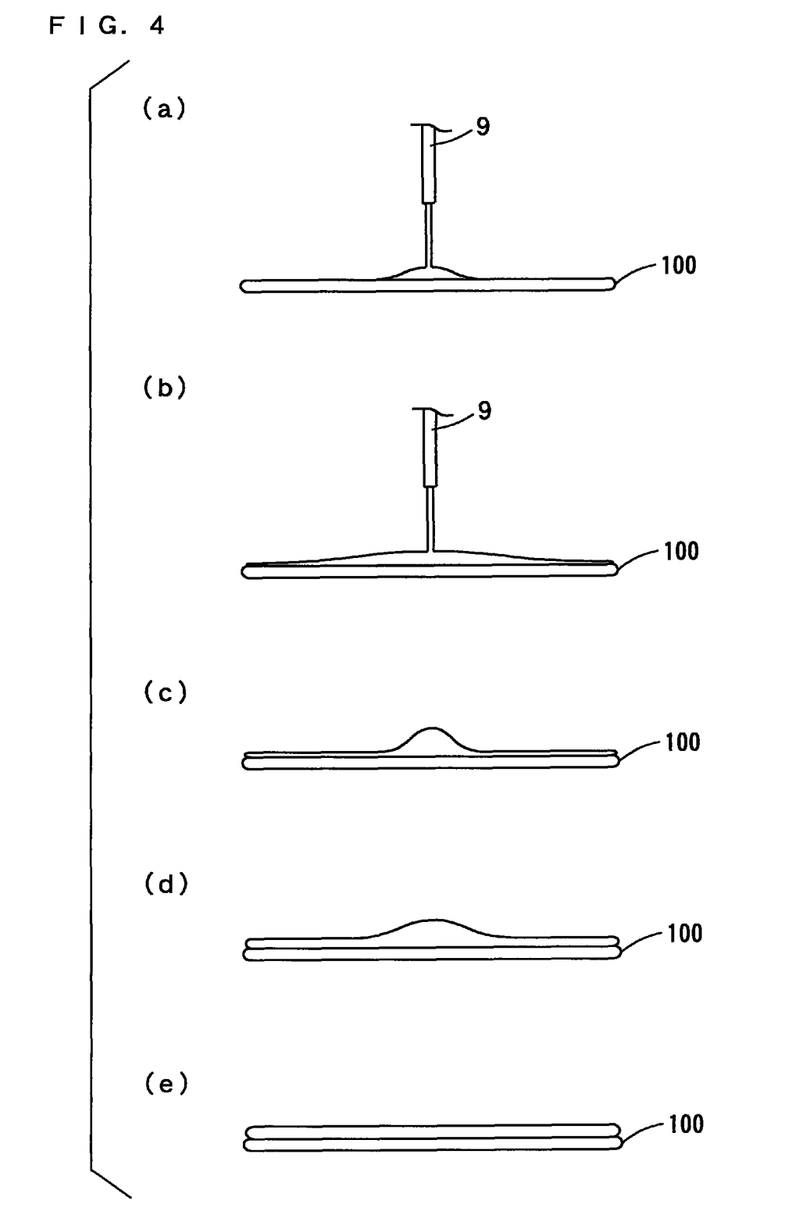
FIG. 4 is a diagram showing processes in which a resist liquid spreads over a target surface of the substrate.

Next, description is made of details of the above-mentioned film formation step. FIG. 3 is a diagram showing the change in the rotation speed of the substrate 100 and the changes of the signals S1, S2 in the film formation step. FIG. 4 is a diagram showing processes in which the resist liquid spreads over the target surface of the substrate 100.

As described above, the solvent is discharged from the solvent nozzle 9b onto the substrate 100 in a period from the time point t0 to the time point t1, and the rotation of the substrate 100 is started at the time point t2. In this case, the rotation speed of the substrate 100 increases to 3000 rpm (an example of a fourth speed), for example. This causes the solvent discharged onto the substrate 100 to outwardly spread in a radial direction of the target surface of the substrate 100.

In this manner, pre-wet processing in which the solvent is applied onto the entire target surface of the substrate 100 is performed. Thus, when being subsequently applied onto the target surface of the substrate 100, the resist liquid easily spreads over the target surface of the substrate 100. As a result, the film of the resist liquid can be formed on the substrate 100 with a smaller amount of resist liquid.

After the solvent is applied onto the entire target surface of the substrate 100, the resist liquid discharge signal S1 attains a high level at the time point t3. This causes the resist liquid to be discharged from the resist nozzle 9 onto the center portion of the target surface of the substrate 100 (see FIG. 4 (a)). At this time, since the substrate 100 is rotated at a high speed (3000 rpm, for example), the resist liquid discharged onto the substrate 100 outwardly spreads in a radial direction of the target surface of the substrate 100 (see FIG. 4 (b)).

The rotation speed of the substrate 100 starts to decrease at a time point t4, and reaches 100 rpm (an example of a first speed), for example, after a certain period of time. Then, the resist liquid discharge signal S1 attains a low level, and the discharge of the resist liquid is stopped at the time point t5. In this case, the centrifugal force applied to the resist liquid on the center portion of the substrate 100 becomes much smaller than that applied to the resist liquid on the peripheral portion. Therefore, a larger amount of the resist liquid is accumulated on the center portion of the target surface of the substrate 100 than that on the peripheral portion (see FIG. 4 (c)).

Next, the rotation of the substrate 100 is accelerated in a period from a time point t6 to a time point t7 (an example of a first period). The rotation speed of the substrate 100 reaches 2000 rpm or higher, such as 3500 rpm (an example of a second speed), at the time point t7.

Here, acceleration of the rotation of the substrate 100 in the period from the time point t6 to the time point t7 (a ratio of an increase in the rotation speed per unit time) is 10000 rpm/s or higher. Thus, the resist liquid on the center portion of the substrate 100 spreads over the peripheral portion of the substrate 100 while being dried. Therefore, the film of the resist liquid can be formed on the substrate 100 even when the amount of the supplied resist liquid is small (see FIG. 4 (d)).

The rotation of the substrate 100 is subsequently decelerated in a period from the time point t7 to a time point t8 (an example of a second period). The rotation speed of the substrate 100 reaches 1000 rpm (an example of a third speed), for example, at the time point t8.

Here, deceleration (a ratio of a decrease in the rotation speed per unit time) of the rotation of the substrate 100 in the period from the time point t7 to the time point t8 is less than 10000 rpm/s. In this case, the centrifugal force applied to the resist liquid on the peripheral portion of the substrate 100 is significantly reduced, and the centrifugal force applied to the resist liquid on the center portion of the substrate 100 is hardly reduced. Thus, an amount of the resist liquid flowing from the peripheral portion of the substrate 100 to the outside of the substrate 100 decreases, and the resist liquid that has spread from the center portion to the peripheral portion of the substrate 100 is maintained on the peripheral portion of the substrate 100. As a result, film thickness uniformity of the resist liquid on the substrate 100 can be ensured (see FIG. 4 (e)).

In the period from the time point t7 to the time point t8, the rotation speed of the substrate 100 linearly decreases. This makes it difficult to generate airflow caused by the rotation of the substrate 100 in a periphery of the substrate 100. This prevents the airflow from affecting the film of the resist liquid at the time of drying the resist liquid on the substrate 100. As a result, a trace of the airflow is prevented from remaining on the film of the resist liquid formed on the substrate 100.

Thereafter, the rotation speed of the substrate 100 is maintained at 1000 rpm, for example. Thus, the film thickness of the resist liquid of the substrate 100 is adjusted while being kept in a substantially uniform state. After the resist liquid is dried and the film is formed on the target surface of the substrate 100, the processing step proceeds to the above-mentioned cleaning step.

(4) Effects

In the substrate processing apparatus and substrate processing method according to the present embodiment, the rotation of the substrate 100 is accelerated in the period from the time point t6 to the time point t7, so that the resist liquid on the center portion of the substrate 100 spreads over the peripheral portion of the substrate 100 while being dried. Accordingly, the film of the resist liquid can be formed on the substrate 100 even though the amount of the supplied resist liquid is small.

The rotation of the substrate 100 is decelerated in the period from the time point t7 to the time point t8, so that the centrifugal force applied to the resist liquid on the peripheral portion of the substrate 100 is significantly reduced and the centrifugal force applied to the resist liquid on the center portion of the substrate 100 is hardly reduced. This prevents the resist liquid from accumulating only on the center portion of the substrate 100. As a result, the film thickness uniformity of the resist liquid on the substrate 100 can be ensured.

The acceleration of the rotation of the substrate 100 in the period from the time point t6 to the time point t7 is 10000 rpm/s or higher, and the deceleration of the rotation of the substrate 100 in the period from the time point t7 to the time point t8 is less than 10000 rpm/s.

This allows the resist liquid on the center portion of the substrate 100 to efficiently spread over the peripheral portion of the substrate 100. Accordingly, the film thickness uniformity of the resist liquid on the substrate 100 can be efficiently ensured.

The speed at the time point t7 is 2000 rpm or higher. Thus, the resist liquid on the center portion of the substrate 100 can efficiently spread over the peripheral portion of the substrate 100 while being dried. Accordingly, the film of the resist liquid can be more reliably formed on the substrate 100 even though the amount of the supplied resist liquid is small.

[2] Second Embodiment

Description will be made of a substrate processing apparatus and a substrate processing method according to a second embodiment while referring to differences from the substrate processing apparatus 200 and the substrate processing method according to the first embodiment. Each of the second to fifth embodiments describes details of only the film formation step of the substrate 100, which is different from the film formation step of the first embodiment.

Figure 5:
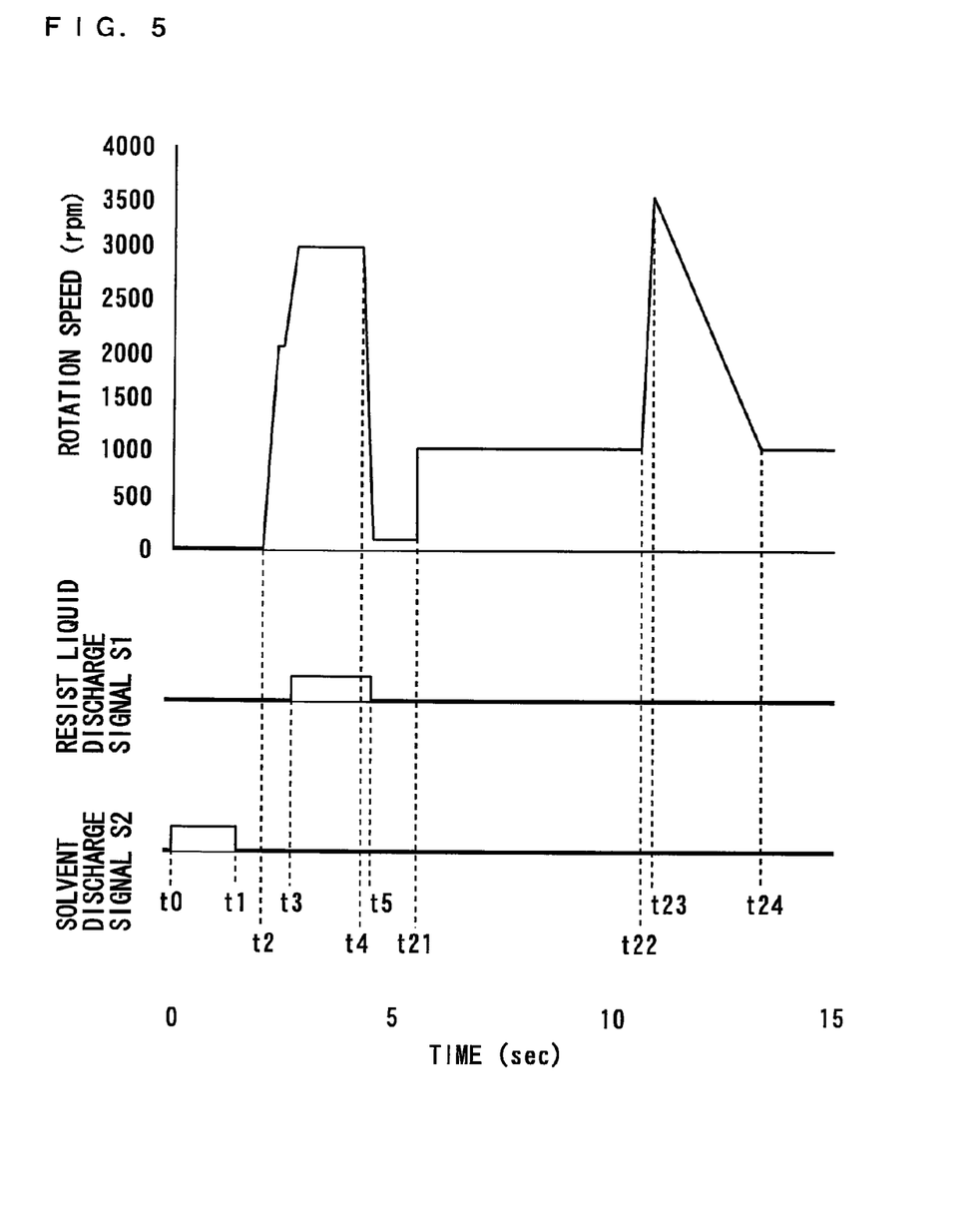
FIG. 5 is a diagram showing a change in the rotation speed of the substrate and changes of the signals in a film formation step of a second embodiment.

FIG. 5 is a diagram showing a change in the rotation speed of the substrate 100 and changes of the signals S1, S2 in the film formation step of the second embodiment.

As shown in FIG. 5, the rotation speed of the substrate 100 starts to decrease at the time point t4, and reaches 100 rpm (an example of a fifth speed), for example, after a certain period of time in the present embodiment. The discharge of the resist liquid is stopped at the time point t5, and then the rotation speed of the substrate 100 increases from 100 rpm to 1000 rpm (an example of the first speed), for example, at a time point t21.

The rotation speed of the substrate 100 is maintained at 1000 rpm, for example, in a period from the time point t21 to a time point t22. This allows the resist liquid on the substrate 100 to be sufficiently dried in the period from the time point t21 to the time point t22. Therefore, the film of the resist liquid can be more efficiently formed on the substrate 100 in the case of using a resist liquid with slow drying characteristics as compared with the resist liquid of the first embodiment.

Next, the rotation of the substrate 100 is accelerated in a period from the time point t22 to a time point t23 (an example of the first period). The rotation speed of the substrate 100 reaches 2000 rpm or higher, such as 3500 rpm (the example of the second speed), at the time point t23.

Here, the acceleration of the rotation of the substrate 100 in the period from the time point t22 to the time point t23 is 10000 rpm/s or higher. Thus, the resist liquid on the center portion of the substrate 100 spreads over the peripheral portion of the substrate 100 while being dried. Therefore, the film of the resist liquid can be formed on the substrate 100 even though the amount of the supplied resist liquid is small.

The rotation of the substrate 100 is subsequently decelerated in a period from the time point t23 to a time point t24 (an example of the second period). The rotation speed of the substrate 100 reaches 1000 rpm (the example of the third speed), for example, at the time point t24.

Here, the deceleration of the rotation of the substrate 100 in the period from the time point t23 to the time point t24 is less than 10000 rpm/s. In this case, the centrifugal force applied to the resist liquid on the peripheral portion of the substrate 100 is significantly reduced, and the centrifugal force applied to the resist liquid on the center portion of the substrate 100 is hardly reduced. Thus, the amount of the resist liquid flowing from the peripheral portion of the substrate 100 to the outside of the substrate 100 decreases, and the resist liquid that has spread from the center portion to the peripheral portion of the substrate 100 is maintained on the peripheral portion of the substrate 100. As a result, the film thickness uniformity of the resist liquid on the substrate 100 can be ensured.

Thereafter, the rotation speed of the substrate 100 is maintained at 1000 rpm, for example. Thus, the film thickness of the resist liquid of the substrate 100 is adjusted while being kept in the substantially uniform state. After the resist liquid is dried and the film is formed on the target surface of the substrate 100, the processing step proceeds to the above-mentioned cleaning step.

[3] Third Embodiment

Description will be made of a substrate processing apparatus and a substrate processing method according to a third embodiment while referring to differences from the substrate processing apparatus 200 and the substrate processing method according to the first embodiment.

Figure 6:
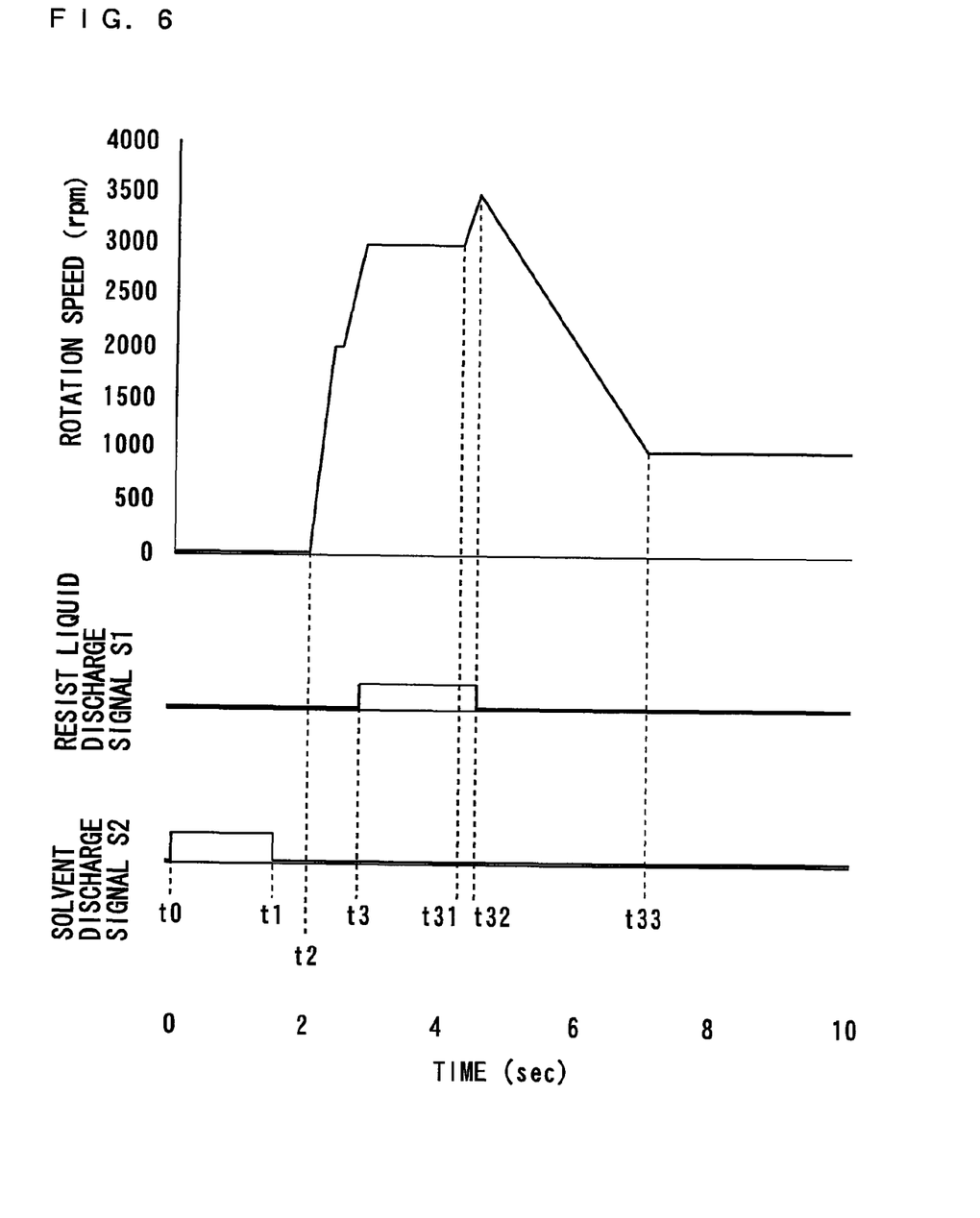
FIG. 6 is a diagram showing a change in the rotation speed of the substrate and changes of the signals in a film formation step of a third embodiment.

FIG. 6 is a diagram showing a change in the rotation speed of the substrate 100 and changes of the signals S1, S2 in a film formation step of the third embodiment.

As shown in FIG. 6, the rotation speed of the substrate 100 starts to increase at the time point t2, and reaches 3000 rpm (the example of the fourth speed), for example, after a certain period of time in the present embodiment. After the resist liquid is discharged from the resist nozzle 9 onto the center portion of the target surface of the substrate 100 at the time point t3, the rotation speed of the substrate 100 is maintained at 3000 rpm (the example of the first speed), for example, until a time point t31.

The rotation of the substrate 100 is subsequently accelerated in a period from the time point t31 to a time point t32 (an example of the first period). The rotation speed of the substrate 100 reaches 2000 rpm or higher, such as 3500 rpm (the example of the second speed), at the time point t32.

Here, the acceleration of the rotation of the substrate 100 in the period from the time point t31 to the time point t32 is 10000 rpm/s or higher. The discharge of the resist liquid from the resist nozzle 9 is stopped at the time point t32.

As described above, a period, in which the rotation speed of the substrate 100 is decreased and the resist liquid is sufficiently dried, is not provided after the time period t3 in the present embodiment. Therefore, the film of the resist liquid can be more efficiently formed on the substrate 100 in the case of using a resist liquid with quick drying characteristics as compared with the resist liquid of the first embodiment.

The rotation of the substrate 100 is decelerated in a period from the time point t32 to a time point t33 (an example of the second period). The rotation speed of the substrate 100 reaches 1000 rpm (the example of the third speed), for example, at the time point t33.

Here, the deceleration of the rotation of the substrate 100 in the period from the time point t32 to the time point t33 is less than 10000 rpm/s. In this case, the centrifugal force applied to the resist liquid on the peripheral portion of the substrate 100 is significantly reduced, and the centrifugal force applied to the resist liquid on the center portion of the substrate 100 is hardly reduced. Thus, the amount of the resist liquid flowing from the peripheral portion of the substrate 100 to the outside of the substrate 100 decreases, and the resist liquid that has spread from the center portion to the peripheral portion of the substrate 100 is maintained on the peripheral portion of the substrate 100. As a result, the film thickness uniformity of the resist liquid on the substrate 100 can be ensured.

Thereafter, the rotation speed of the substrate 100 is maintained at 1000 rpm, for example. Thus, the film thickness of the resist liquid of the substrate 100 is adjusted while being kept in the substantially uniform state. After the resist liquid is dried and the film is formed on the target surface of the substrate 100, the processing step proceeds to the above-mentioned cleaning step.

[4] Fourth Embodiment

Description will be made of a substrate processing apparatus and a substrate processing method according to a fourth embodiment while referring to differences from the substrate processing apparatus 200 and the substrate processing method according to the first embodiment.

Figure 7:
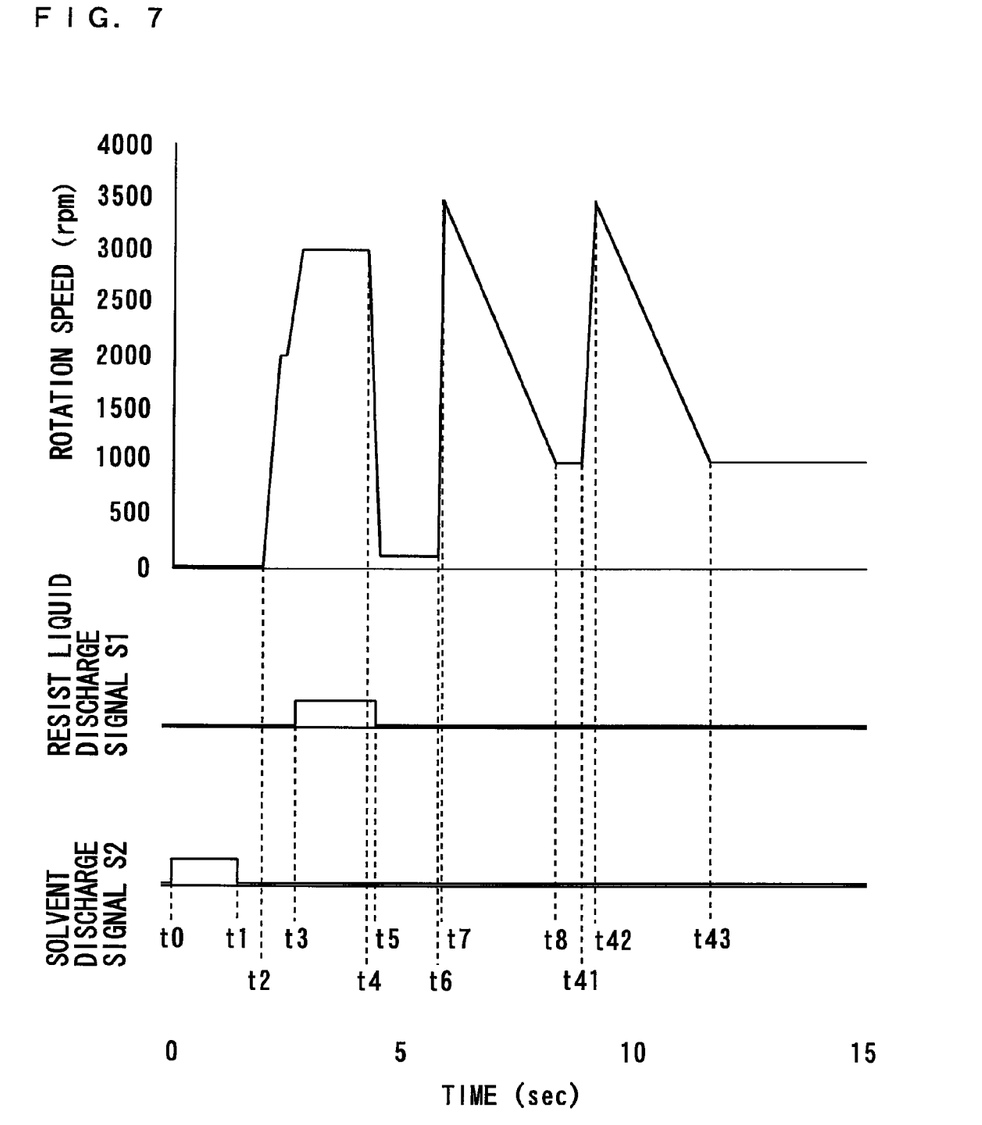
FIG. 7 is a diagram showing a change in the rotation speed of the substrate and changes of the signals in a film formation step of a fourth embodiment.

FIG. 7 is a diagram showing a change in the rotation speed of the substrate 100 and changes of the signals S1, S2 in a film formation step of the fourth embodiment.

As shown in FIG. 7, the change in the rotation speed of the substrate 100 in a period from the time point t0 to the time point t8 in the present embodiment is the same as that in a period from the time point t0 to the time point t8 in the first embodiment.

In the present embodiment, the rotation speed of the substrate 100 decreases to 1000 rpm (the example of the third speed), for example, at the time point t8, and then maintained at 1000 rpm (an example of a first speed in the second cycle), for example, until a time point t41.

Then, the rotation of the substrate 100 is accelerated in a period from the time point t41 to a time point t42 (an example of a first period in the second cycle). The rotation speed of the substrate 100 reaches 2000 rpm or higher, such as 3500 rpm (an example of a second speed in the second cycle) at the time point t42. Here, the acceleration of the rotation of the substrate 100 in the period from the time point t41 to the time point t42 is 10000 rpm/s or higher.

The rotation of the substrate 100 is decelerated in a period from the time point t42 to a time point t43 (an example of the second period in the second cycle). The rotation speed of the substrate 100 reaches 1000 rpm (the example of the first speed in the second cycle), for example, at the time point t43. Here, the deceleration of the rotation of the substrate 100 in the period from the time point t42 to the time point t43 is less than 10000 rpm/s.

In this manner, another cycle in which the rotation speed of the substrate 100 increases and then decreases is performed after the time point t8 in the present embodiment. This causes the resist liquid on the center portion of the substrate 100 to more easily spread over the peripheral portion of the substrate 100. This sufficiently prevents the resist liquid from accumulating only on the center portion of the substrate 100. As a result, the film thickness uniformity of the resist liquid on the substrate 100 is further improved as compared with the first embodiment.

Thereafter, the rotation speed of the substrate 100 is maintained at 1000 rpm, for example. Thus, the film thickness of the resist liquid on the substrate 100 is adjusted while being kept in the substantially uniform state. After the resist liquid is dried and the film is formed on the target surface of the substrate 100, the processing step proceeds to the above-mentioned cleaning step.

[5] Fifth Embodiment

Description will be made of a substrate processing apparatus and a substrate processing method according to a fifth embodiment while referring to differences from the substrate processing apparatus 200 and the substrate processing method according to the first embodiment.

Figure 8:
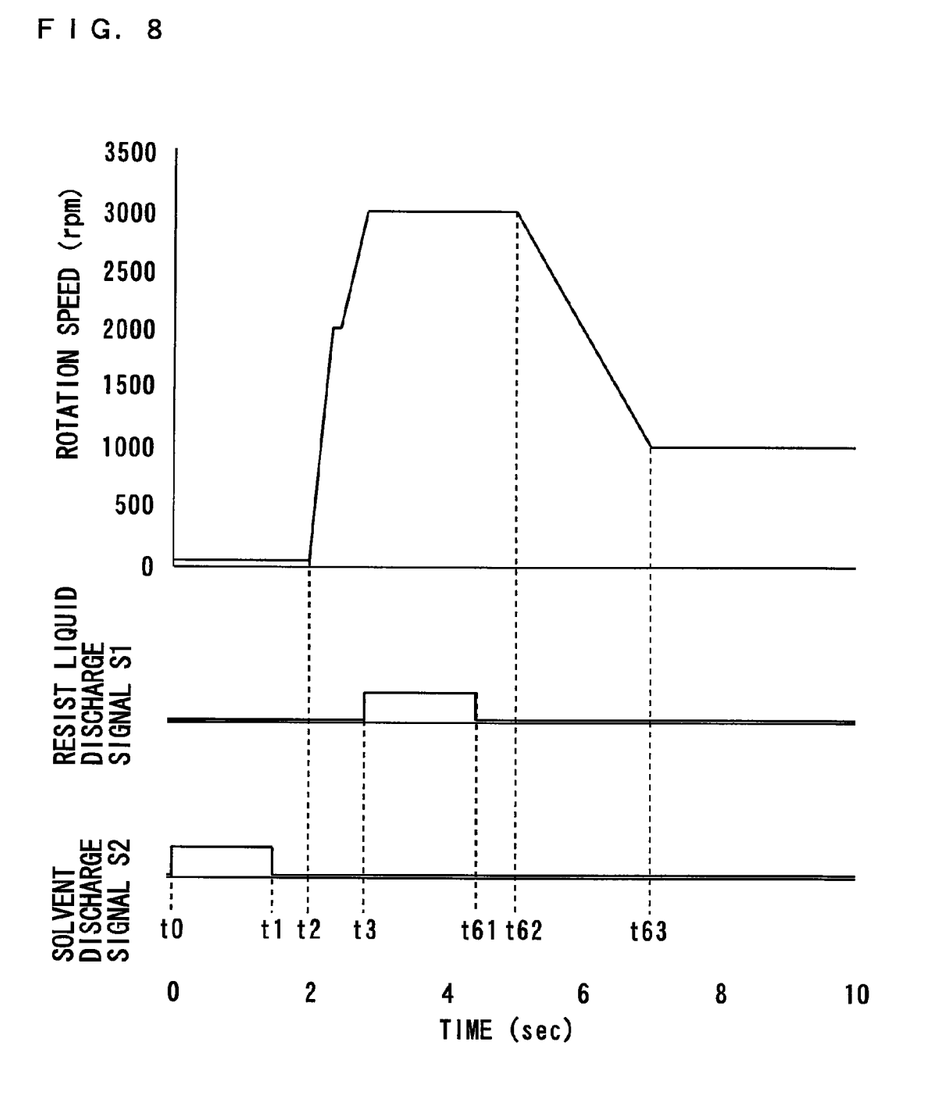
FIG. 8 is a diagram showing a change in the rotation speed of the substrate and changes of the signals in a film formation step of a fifth embodiment.

FIG. 8 is a diagram showing a change in the rotation speed of the substrate 100 and changes of the signals S1, S2 in a film formation step of the fifth embodiment.

As shown in FIG. 8, the rotation speed of the substrate 100 starts to increase at the time point t2, and reaches 3000 rpm, for example, after a certain period of time to be maintained constant in the present embodiment. The resist liquid is discharged from the resist nozzle 9 onto the substrate 100 in a period from the time point t3 to a time point t61.

Then, the rotation of the substrate 100 is decelerated in a period from a time point t62 to a time point t63 (an example of a predetermined period). The rotation speed of the substrate 100 reaches 1000 rpm, for example, at the time point t63.

Here, the deceleration of the rotation of the substrate 100 in the period from the time point t62 to the time point t63 is less than 10000 rpm/s. In this case, the centrifugal force applied to the resist liquid on the peripheral portion of the substrate 100 is significantly reduced, and the centrifugal force applied to the resist liquid on the center portion of the substrate 100 is hardly reduced. Thus, the amount of the resist liquid flowing from the peripheral portion of the substrate 100 to the outside of the substrate 100 decreases, and the resist liquid that has spread from the center portion to the peripheral portion of the substrate 100 is maintained on the peripheral portion of the substrate 100. As a result, the film thickness uniformity of the resist liquid on the substrate 100 can be ensured.

As described above, the period, in which the rotation speed of the substrate 100 is decreased and the resist liquid is sufficiently dried, is not provided after the time period t3 in the present embodiment. Therefore, the film of the resist liquid can be more efficiently formed on the substrate 100 in the case of using a resist liquid with quick drying characteristics as compared with the resist liquid of the first embodiment.

Thereafter, the rotation speed of the substrate 100 is maintained at 1000 rpm, for example. Thus, the film thickness of the resist liquid of the substrate 100 is adjusted while being kept in the substantially uniform state. After the resist liquid is dried and the film is formed on the target surface of the substrate 100, the processing step proceeds to the above-mentioned cleaning step.

[6] Other Embodiments

While the resist liquid is used as the coating liquid in the foregoing embodiments, the present invention is not limited to this. Various coating liquids such as a liquid for forming an antireflection film or a liquid for forming a protective film protecting the resist film can be used.

The rotation speeds of the substrate 100 in the foregoing first to fifth embodiments are described as examples, and the present invention is not limited to the foregoing rotation speeds. The rotation speeds of the substrate 100 can be suitably set according to various elements such as the solvent to be used, the size of the substrate 100, viscosity of the coating liquid, and ease of drying of the coating liquid.

While the rotation speed of the substrate 100 linearly increases in the period from the time point t6 to the time point t7 (the example of the first period) in the first embodiment, the rotation speed of the substrate 100 may increase in a curve.

While the rotation speed of the substrate 100 linearly decreases in the period from the time point t7 to the time point t8 (the example of the second period), the rotation speed of the substrate 100 may decrease in a curve.

While the rotation speed of the substrate 100 is maintained constant in a period from the time point t2 to the time point t4 and a period from the time point t5 to the time point t6, the rotation speed of the substrate 100 may continuously or gradually change.

In the second embodiment, while the rotation speed of the substrate 100 linearly increases in the period from the time point t22 to the time point t23 (the example of the first period), the rotation speed of the substrate 100 may increase in a curve.

While the rotation speed of the substrate 100 linearly decreases in the period from the time point t23 to the time point t24 (the example of the second period), the rotation speed of the substrate 100 may decrease in a curve.

While the rotation speed of the substrate 100 is maintained constant in the period from the time point t2 to the time point t4, a period from the time point t4 to the time point t21, and the period from the time point t21 to the time point t22, the rotation speed of the substrate 100 may continuously or gradually change.

The cycle from the time point t21 to the time point t24 may be performed twice or more.

In the third embodiment, while the rotation speed of the substrate 100 linearly increases in the period from the time point t31 to the time point t32 (the example of the first period), the rotation speed of the substrate 100 may increase in a curve.

While the rotation speed of the substrate 100 linearly decreases in the period from the time point t32 to the time point t33 (the example of the second period), the rotation speed of the substrate 100 may decrease in a curve.

While the rotation speed of the substrate 100 is maintained constant in a period from the time point t2 to the time point t31, the rotation speed of the substrate 100 may continuously or gradually change.

While the rotation speed of the substrate 100 linearly increases in the period from the time point t6 to the time point t7 (the example of the first period) and the period from the time point t41 to the time point t42 (the example of the first period in the second cycle) in the fourth embodiment, the rotation speed of the substrate 100 may increase in a curve.

While the rotation speed of the substrate 100 linearly decreases in the period from the time point t7 to the time point t8 (the example of the second period) and the period from the time point t42 to the time point t43 (the example of the second period in the second cycle), the rotation speed of the substrate 100 may decrease in a curve.

While the rotation speed of the substrate 100 is maintained constant in the period from the time point t2 to the time point t4, the period from the time point t5 to the time point t6, and a period from the time point t8 to the time point t41, the rotation speed of the substrate 100 may continuously or gradually change.

At the time point t8 and thereafter, the cycle from the time point t41 to the time point t43 may be performed twice or more.

While the rotation speed of the substrate 100 linearly decreases in the period from the time point t62 to the time point t63 (the example of the predetermined period) in the fifth embodiment, the rotation speed of the substrate 100 may decrease in a curve.

While the rotation speed of the substrate 100 is maintained constant in a period from the time point t2 to the time point t62, the rotation speed of the substrate 100 may continuously or gradually change.

[7] Correspondences Between Elements in the Claims and Parts in Embodiments

In the following paragraph, non-limiting examples of correspondences between various elements recited in the claims below and those described above with respect to various preferred embodiments of the present invention are explained.

In the foregoing embodiments, the substrate 100 is an example of a substrate, the resist liquid is an example of a coating liquid, the substrate processing apparatus 200 is an example of a substrate processing apparatus, the resist nozzle 9 is an example of a coating liquid supply system, the motor 3 is an example of a rotating/holding device, and the controller 12 is an example of a controller.

As each of various elements recited in the claims, various other elements having configurations or functions described in the claims can be also used.

[8] Inventive Example

A relationship between the consumption of the resist liquid and the state of the film of the resist liquid (hereinafter referred to as the resist film) formed on the substrate 100 was examined in the following inventive example and comparative example.

In the inventive example, the rotation speed of the substrate 100, the discharge timing of the resist liquid, and the discharge timing of the solvent were changed as shown in FIG. 3 in the film formation step of the substrate 100.

Figure 9:
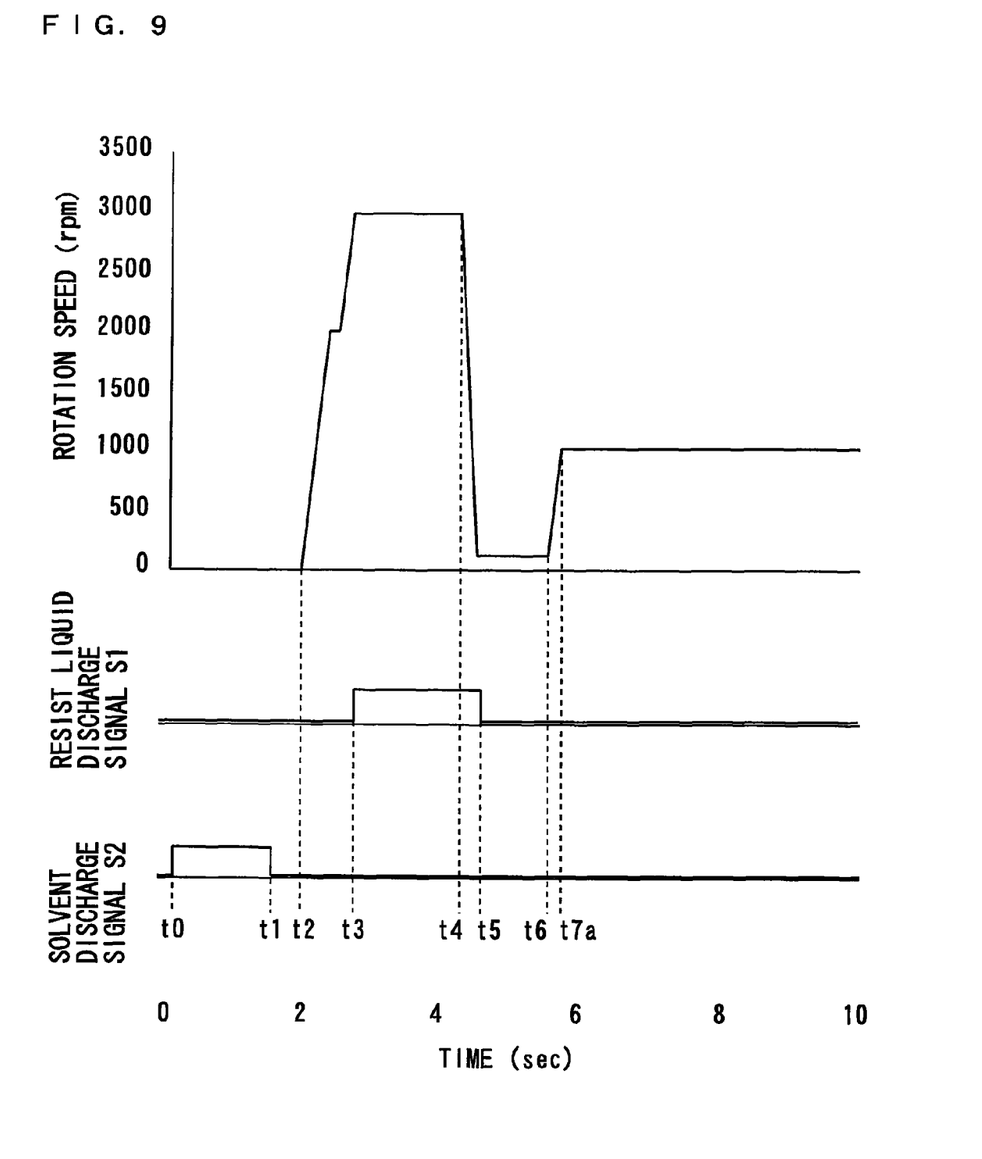
FIG. 9 is a diagram showing a change in the rotation speed of the substrate and changes of the signals in a comparative example.

FIG. 9 is a diagram showing a change in the rotation speed of the substrate 100 and changes of the signals S1, S2 in the comparative example. In the comparative example, the rotation speed of the substrate 100, the discharge timing of the resist liquid and the discharge timing of the solvent were changed as shown in FIG. 9 in the film formation step of the substrate 100. The example shown in FIG. 9 is different from the example shown in FIG. 3 in that a period in which the rotation of the substrate 100 is accelerated and then decelerated is not provided at the time point t6 and the rotation speed of the substrate 100 is maintained constant at a time point t7a and thereafter. The rotation speed of the substrate 100 at the time point t7a and thereafter is the same as that at the time point t8 and thereafter in FIG. 3.

The cleaning step of the substrate 100 that is the same as that shown in FIG. 2 was performed in the inventive example and the comparative example.

In the foregoing inventive example and comparative example, a discharge amount of the resist liquid was set to a range from 0.25 ml to 0.60 ml, and it was examined whether the resist liquid was uniformly formed on the substrate 100.

Results of measurement of a consumed amount of the resist in the inventive example and the comparative example are shown in Table 1.

TABLE 1

| RESIST LIQUID DISCHARGE AMOUNT | INVENTIVE EXAMPLE | COMPARATIVE EXAMPLE |
| --- | --- | --- |
| 0.25 ml | x | x |
| 0.30 ml | o | x |
| 0.35 ml | o | x |
| 0.40 ml | o | x |
| 0.45 ml | o | x |
| 0.50 ml | o | x |
| 0.55 ml | o | x |
| 0.60 ml | o | o |

As shown in Table 1, the resist film was uniformly formed on the substrate 100 when the discharge amount of the resist liquid is 0.30 ml or more in the inventive example. On the other hand, the resist film was uniformly formed on the substrate 100 when the used amount of the resist liquid was 0.60 ml or more in the comparative example.

The results of the inventive example and the comparative example show that the resist film can be uniformly formed on the target surface of the substrate 100 while the consumed amount of the resist liquid can be reduced by providing a period from the time point t6 to the time point t8 in which the decreased rotation of the substrate 100 is accelerated and then decelerated.

While preferred embodiments of the present invention have been described above, it is to be understood that variations and modifications will be apparent to those skilled in the art without departing the scope and spirit of the present invention. The scope of the present invention, therefore, is to be determined solely by the following claims.

We claim:

1. A substrate processing method for forming a film of a coating liquid on a substrate, comprising the steps of:
    rotating the substrate in a horizontal attitude;
    supplying the coating liquid onto the substrate that is rotated;
    increasing a rotation speed of the substrate from a first speed to a second speed in a first period after supply of said coating liquid; and
    decreasing the rotation speed of the substrate from said second speed to a third speed in a second period immediately after said first period, wherein
    deceleration of rotation of the substrate in said second period is smaller than acceleration of rotation of the substrate in said first period.

2. The substrate processing method according to claim 1, wherein said step of increasing the rotation speed of the substrate from the first speed to the second speed in the first period after the supply of said coating liquid includes spreading the coating liquid over a peripheral portion of the substrate while drying the coating liquid on a center portion of the substrate.

3. The substrate processing method according to claim 1, wherein said step of decreasing the rotation speed of the substrate from said second speed to the third speed in said second period includes making a reduction in a centrifugal force applied to the coating liquid on the center portion of the substrate smaller than a reduction in the centrifugal force applied to the coating liquid on the peripheral portion of the substrate.

4. The substrate processing method according to claim 1, wherein said step of rotating the substrate in the horizontal attitude includes setting the rotation speed of the substrate when the supply of the coating liquid is started to a fourth speed that is higher than said third speed.

5. The substrate processing method according to claim 4, wherein said step of supplying the coating liquid onto the substrate that is rotated includes setting the rotation speed of the substrate to said first speed by end of the supply of the coating liquid, wherein
    said first speed is lower than said third speed.

6. The substrate processing method according to claim 4, wherein said step of supplying the coating liquid onto the substrate that is rotated includes:
    setting the rotation speed of the substrate to a fifth speed that is lower than said first speed and said third speed by the end of the supply of the coating liquid.

7. The substrate processing method according to claim 4, wherein said step of supplying the coating liquid onto the substrate that is rotated includes setting the rotation speed of the substrate to said first speed in a period from the start of the supply of the coating liquid to start of said first period, wherein said first speed is equal to said fourth speed.

8. The substrate processing method according to claim 1, further comprising the step of performing one or a plurality of cycles in which the rotation speed of the substrate is reduced immediately after the rotation speed of the substrate is increased after said second period, wherein the deceleration of the rotation of the substrate in each of the cycles is smaller than the acceleration of the rotation of the substrate.

9. The substrate processing method according to claim 1, wherein the acceleration of the rotation of the substrate in said first period is not less than 10000 rpm/s, and the deceleration of the rotation of the substrate in said second period is smaller than 10000 rpm/s.

10. The substrate processing method according to claim 1, wherein said second speed is not less than 2000 rpm.

* * * * *